Figure 4:
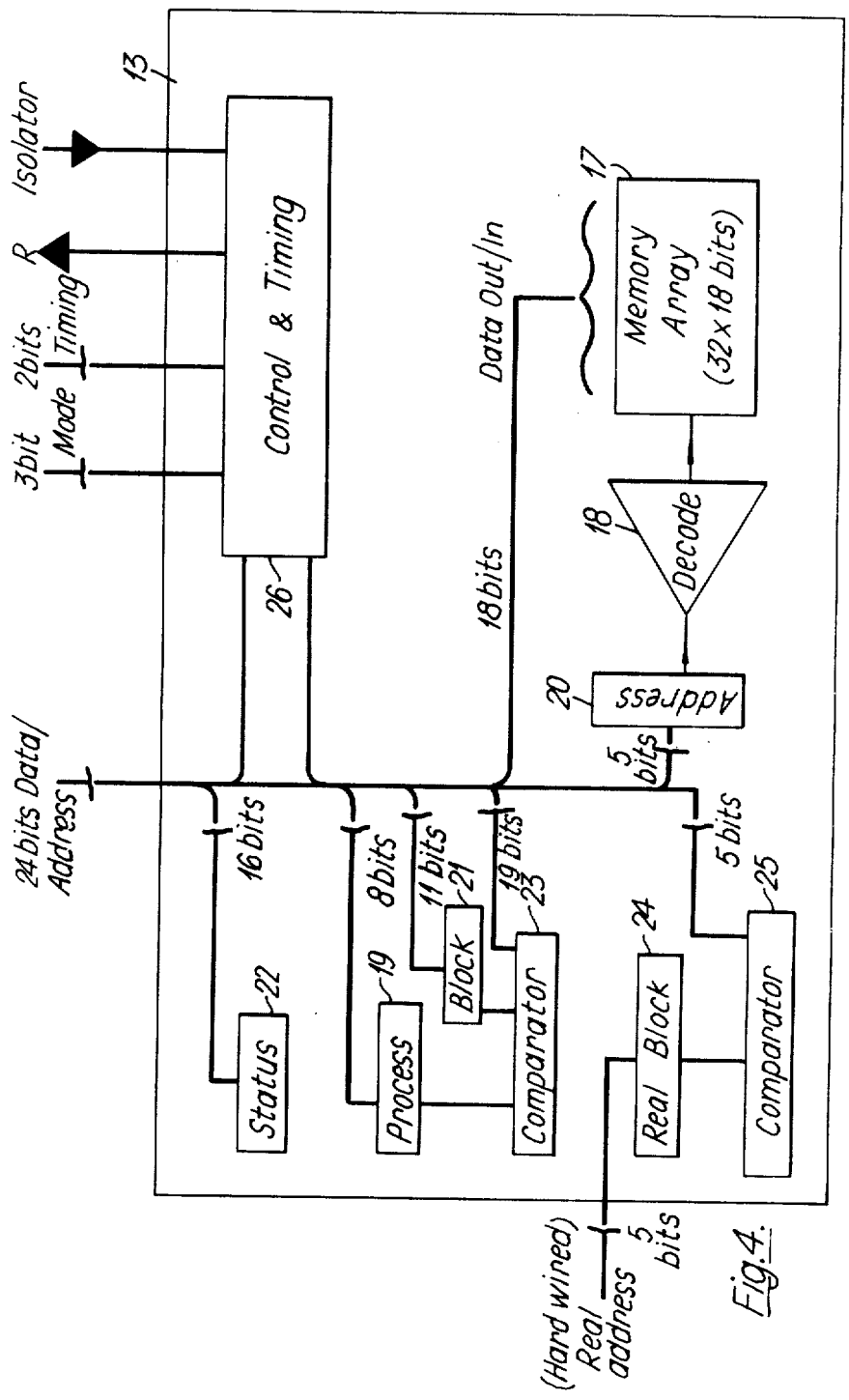

United States Patent [19]
Parsons et al.

[11] 3,983,537
[45] Sept. 28, 1976

[54] RELIABILITY OF RANDOM ACCESS MEMORY SYSTEMS

[75] Inventors: Brian Jeremy Parsons, Stevenage; Lynne Margaret Pursell, Rayleigh, both of England

[73] Assignee: Hawker Siddeley Dynamics Limited, England

[22] Filed: Apr. 1, 1974

[21] Appl. No.: 456,647

[52] U.S. Cl. .................. 340/172.5; 340/173 R; 235/153 AK
[51] Int. Cl.² .................. G06F 11/00; G11C 11/00
[58] Field of Search .......... 340/172.5, 173 R; 307/238; 235/153 AK; 444/1

[56] References Cited
UNITED STATES PATENTS

| | | | |
|---|---|---|---|
| 3,585,605 | 6/1971 | Gardner et al. | 340/172.5 |
| 3,633,175 | 1/1972 | Harper | 340/172.5 |
| 3,753,242 | 8/1973 | Townsend | 340/174 SP |
| 3,753,244 | 8/1973 | Sumilas et al. | 340/172.5 |
| 3,755,791 | 8/1973 | Arzubi | 340/172.5 |
| 3,781,826 | 12/1973 | Beausoleil | 340/173 R |
| 3,803,560 | 8/1974 | De Voy et al. | 235/153 |
| 3,821,715 | 6/1974 | Hoff, Jr. et al. | 340/172.5 |

Primary Examiner—Edward J. Wise
Attorney, Agent, or Firm—Rose & Edell

[57] ABSTRACT

A digital memory is configured as a hierarchical system with at least three levels. The first level consists of a main bus and interfacing for one or more main memory units; the second level consists of a separate second level bus in each main memory unit with a plurality of memory frames independently interfaced to each bus; and the third level consists of a separate third level bus in each memory frame with a plurality of memory storage blocks independently interfaced to each bus. Virtual addressing is employed in which the whole of each address is decoded in the individual memory block which includes for the purpose software settable registers containing identification numbers.

8 Claims, 4 Drawing Figures

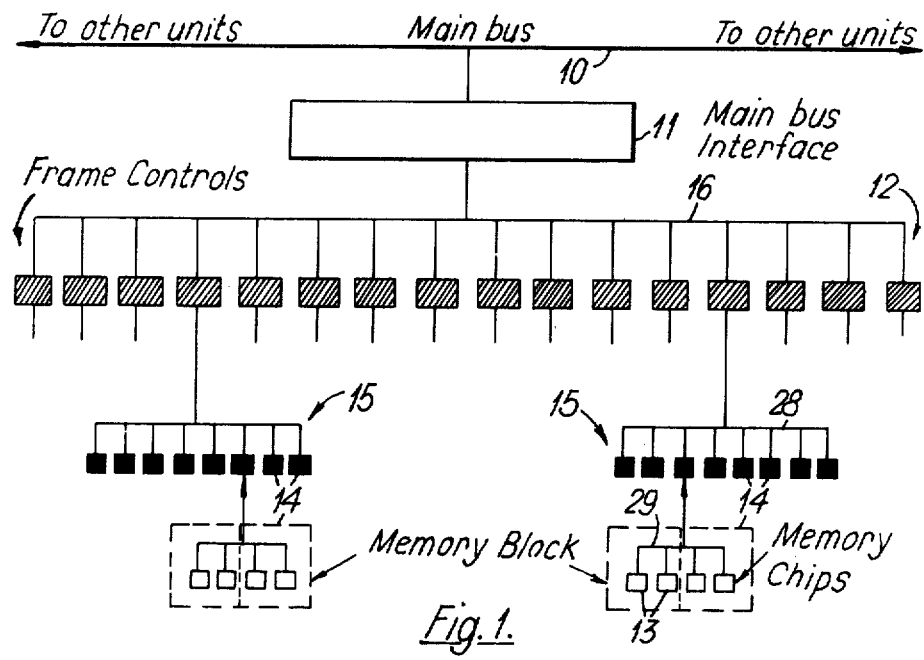
Fig. 1.
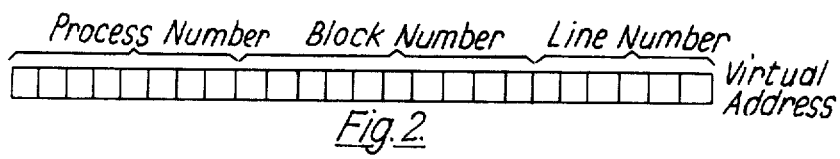
Fig. 2.
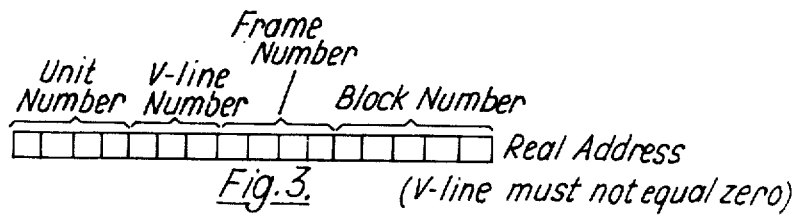
Fig. 3. (V-line must not equal zero)

RELIABILITY OF RANDOM ACCESS MEMORY SYSTEMS

This invention relates to the memory systems of computers and is especially, but not solely, concerned with large scale integrated circuit semiconductor memories. The invention is applicable as a whole to random access and other read/write memories, and in some degree to read only memories.

It is an object of the invention to achieve memories with the following features:
a. modular construction, capable of easy expansion;
b. high reliability, with easy reconfiguration;
c. virtual addressing, with easy reallocation.

According to the present invention, there is provided a digital memory system hierarchically organised with at least three levels in the hierarchy, and comprising a plurality of main memory units each independently interfaced to a first level bus, each main memory unit itself in turn comprising a plurality of memory frames or sub-units each independently interfaced to a second level bus within and respective to the unit, each memory frame or sub-unit itself in turn comprising a plurality of memory storage blocks each independently interfaced to a third level bus within and respective to the frame. Each memory storage block may comprise at least one storage array and be arranged for virtual addressing, the block containing means for decoding the whole of an address applied from the main bus through the several levels of the hierarchy. For address decoding, the memory block may employ a block-identifying number or numbers in one or more block registers that are individually settable, e.g. by software.

In the preferred arrangement, there is means for isolating each memory storage block from the remainder of the system, and means for isolating each memory frame or sub-unit from the remainder of the system.

By this means it is possible to implement a memory of any desired size in which faults occurring in individual storage blocks can be isolated and a new block brought into use on the respective third level bus very readily. With the inclusion of redundant memory blocks or modules, any faulty block in use can have its address read and memorised, and a spare block brought into service to replace it and given the same address, the faulty block then being isolated. Also, if necessary, complete frames can be isolated.

This is of great advantage, especially in the field of aerospace computers where the reliability in service of the memory is dependent inter alia on the length of time in service before the memory runs out of spares as faults develop. In prior systems it has been necessary, for achieving good reliability and length of service, to include one spare per memory block but the present system considerably reduces the percentage of spares that need be carried. Thus, the mass and weight penalty is reduced to an important degree. It is also not necessary to have a cumbersome switching facility for switching in spares.

Figure 5:
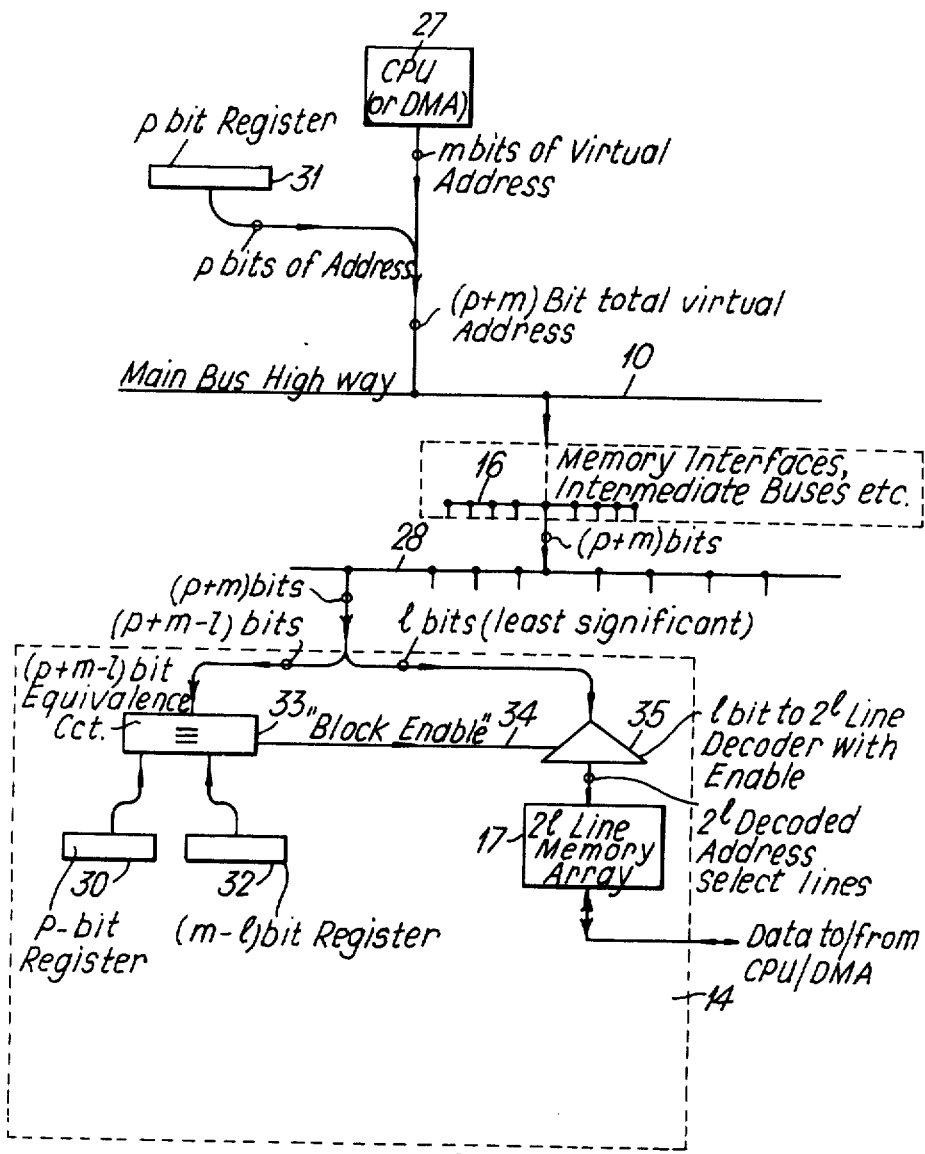

Arrangements according to the invention will now be described by way of example and with reference to the accompanying drawings in which:

FIG. 1 is a block diagram of a random access memory system embodying the invention, FIGS. 2 and 3 illustrate forms of address employed in the system of FIG. 1, FIG. 4 is a diagram of a memory element or chip of the system of FIG. 1, and FIG. 5 is a flow diagram illustrating virtual addressing as applied to a hierarchical memory according to the invention.

The following abbreviations apply:
RAM = Random Access Memory (taken to include all types of Read/Write Memory)
ROM = Read Only Memory
LSI = Large Scale Integration or Large Scale Integrated (circuit) as applicable
CPU = Central Processing Unit
DMA = Direct Memory Access (Unit).
CMOS= Complementary Metal Oxide Silicon Certain terms used in what follows are to be interpreted thus:
"Bus" — a memory bus or highway;
"normal access" or "virtual access" — used interchangeably to indicate a memory access for the purpose of reading stored information from or writing information into storage location;
"real access" — a transfer for the purpose of controlling "hardware stages", e.g. controlling isolators, changing remotely alterable address registers, resetting flip-flops (these are sometimes conventionally performed by "special" input/output commands);
"virtual address", "real address" = the address parts of a virtual access and real access respectively.

RAM Levels

Referring to FIG. 1, a L.S.I. RAM is shown which has a modular construction so as to give high reliability and easy expansion. It consists of three levels which are closely related to the physical organisation of the RAM.

Level 1. (Unit control level). This consists of a RAM control frame 11 containing the necessary equipment to interface with the rest of a computer system via the main bus 10.

Level 2 (Frame control level). This contains a further level of isolation and the necessary logic for real address control and block isolation control. This frame control 12 is used on each memory frame except the RAM control frame above.

Level 3. (Chip level). Each memory chip 13 contains a memory array of 32 words of 18 bits plus address decoding and control logic. The chips are accessed in pairs, giving a basic memory block of 64 words. Two blocks (four memory chips) are packaged in one hybrid package 14, and eight of these packages are placed in one memory frame 15.

Thus each memory frame 15 yields a RAM capacity of better than 1,000 words (18 bits per word) made up of 32 memory chips 13 arranged as 16 (64 word) blocks and the control logic and isolation to operate these blocks. A RAM memory unit consists of more than 16,000 words comprising 16 memory frames 15 and one control frame. The information from the rest of the computer system goes through the RAM control frame 11 and on to the second level sub-bus 16 which distributes it to each frame control 12. The 32 memory chips 13 are then wire-ORed to the frame control 12.

RAM Accessing and Control

At the start of an access the memory system is set to receive information. The recognition of the type of access (real or virtual) takes place first in the interface 11. If the address is a virtual address, then it is passed through the interface and through the frame controls 12 to every memory block in the unit. A block that recognises the virtual address as the one allocated to it, replies and the access continues. If the address is a real address the RAM system interface recognises the RAM unit number and, if the address applies to a line within the memory, the frame and block number are passed on to the level 2 sub-bus 16. One of the frame controls 12 recognises its frame number and only this frame control allows the information through to its memory blocks.

The information stored in the memory array within a chip 13 can only be accessed using a virtual address (FIG. 2). The special registers within a chip (i.e. status, process number, block number) can only be accessed using a real address (FIG. 3).

RAM Chip Details

Referring now to FIG. 4, a RAM memory chip consists of:
 i. A memory array 17 of 576 bits arranged as 32 words of 18 bits.
 ii. The decode logic and drivers 18 to access any one line (word) of the memory array.
 iii. A process number register 19 that is loaded by the operating system with the number of the process that will be able to access this particular chip.
 iv. An address buffer 20 to hold the address of the line being accessed.
 v. A block number register 21 which is also loaded by the operating system when a virtual address is allocated. The last bit of the block number, however, is hardwired so the chip always stores either the top 32 words or the bottom 32 words of a memory block.
 vi. A status register 22 which contains information about the memory block such as:
  A "full/empty" bit that acts as a "chip enable" for virtual address association.
  A transfer inhibit which stops the transfer of this block to a CPU's local store.
  A write inhibit that acts as a disable for the write mechanism in the chip and makes this block a "read only" block.
  A read inhibit that stops the block response to a read request and is used for back-up blocks, e.g. for duplicate storage of vital information.
  A lock-out bit that prevents the block operating at all and provides another way of disabling a block in case of isolator control failure.
 vii. A comparison circuit 23 to compare the virtual address presented to the block, with the process and block number stored.
 viii. A real address block number register 24 in which the address is hard wired.
 ix. A comparison circuit 25 for real address recognition.
 x. The control and timing circuits 26 for the virtual and real, read and write accesses.

When the control circuit 26 of a memory chip recognises that an address is on the address/data wires, it compares the address with its own real or virtual address (depending on the type of access). If equivalence occurs the "access control circuit" is initiated, and a reply is sent. The line number part of the address is staticised and decoded if the address is virtual, or the appropriate register is selected if the address is real.

The read/write then takes place with the data put on/- read off the data wires as appropriate and at the end of the access the control circuit within the chip is reset.

RAM Redundancy organisation

The RAM has a high reliability because of its modular construction and virtual addressing. If a failure within a memory chip 13 is detected by a Central Processor, then the block 14 to which it belongs can be locked out and disabled, by the frame control 12, from the rest of the system. Another block can then be set up by the operating system of the computer with the same virtual address as the faulty block. In the event of a fault that affects all the blocks in a frame 15 a complete frame can be isolated from the rest of the RAM unit, by the Level 1 control 11. If the complete RAM unit fails it can be isolated from the main bus 10 by alternative means. This leaves the rest of the computer working and hence access to other memory units possible. For the most common faults (failure within a memory array), however, only one block (64 words) of store is lost to the system.

BUS HIERARCHY

This concerns the organisation of a memory by means of a "hierarchy" of buses and interfaces/controllers. FIG. 1 shows such a hierarchy for a three-level system. In terms of the hierarchy, the functions of the various parts can again be summarised as follows:

Level 1 Bus: this is the main computer bus or store highway 10 by which the memory unit is accessed from e.g. a CPU, DMA etc.

Level 1 Circuits: these comprise the interface 11 between the whole memory unit (specifically the level 2 Bus 16) and the Level 1 Bus 10. The interface is able to handle transfers to and from other units on the Level 1 Bus 10, although data and address information (and some control) will be passed straight through the interface 11 (via buffers as necessary) to/from the sub-units. The interface 11 may be provided with facilities for isolation (e.g. using CMOS transmission gates) so that a fault on or below the level 2 bus 16 may be isolated to prevent a consequent fault on the Level 1 Bus 10.

Level 2 Bus; this is the main internal bus 16 of the memory unit, and is used for connecting all the various sub-units (see below) to the Level 1 interface 11.

Level 2 Circuits: these comprise a set of interfaces 12 between each sub-unit (specifically each Level 3 bus 28) and the Level 2 bus 16. A sub-unit is chosen to be a convenient amount of memory in between the basic chip/element size and the total memory size. It may, for instance, be one circuit-board or one memory plane. The reason for dividing the total unit into sub-units is primarily for purposes of reliability (although convenient partitioning of, for example, drive and sense electronics may also be obtained). If each Level 2 interface 12 has a facility for isolation, then a fault at the individual memory element level (e.g. memory chip/core 13) or on a level 3 bus 28 will not cause failure of the total memory unit.

Level 3 Bus: each Level 3 bus 28 is contained only within its own sub-unit 15, with no direct connection to another sub-unit. The bus is connected to every memory element (e.g. chip 13) within the sub-unit.

Level 3 Circuits: these are the actual memory elements 13 which comprise the storage capacity of the unit. Apart from the storage cells there is also the address recognition circuitry, control circuitry, readout circuits etc. The memory elements 13 may be of any type, e.g. read-only, read/write, etc. Each memory element or small "block" of elements (e.g. each chip or each group of two to four chips, or a "page" of memory in a paged computer) may contain isolating driver/receivers on to the sub-unit bus if required, thus providing yet another level of isolation, in circumstances where this is desirable.

The principal advantages of this hierarchical approach are as follows:

a. Flexibility, Modularity: by making block size and sub-unit size correspond with some convenient physical partitioning, implementation of different memory sizes (or different mixtures of memory type, e.g. RAM, ROM within a memory) is easily achieved. This is further facilitated if most of the address recognition function is implemented at the lower levels (e.g. level 3 in the example).

b. Reliability: by partitioning the unit into sections and the distribution function into several buses, and by judicious use of the isolation facility, the memory can be arranged so that most single failures will cause only a small part of the memory to become inoperative.

c. Suitability for LSI: by making a block (level 3 circuit) equal to one or more LSI semiconductor memory chips, and a sub-unit (level 2) equal to one (or two) circuit boards, hierarchical memory systems may be easily implemented in LSI.

d. Multiport configurations: if two (or more) Level 1 buses 10 and two (or more) Level 1 interfaces 11 are provided instead of the one of each shown, such that both Level 1 interfaces are connected to a single Level 2 bus 16, then a dual-(or multi-) port memory unit is easily obtained. Similarly, for some purposes it may be desirable to offer two (or more) level 2 buses 16, with corresponding repetition of Level 2 interfaces 12 for those sub-units requiring dual/multi-port access.

Although the description of the Bus hierarchy principle above has been based on a three-level hierarchy, there is no reason why more than three levels should not be used if desired. Choice of organisation in any particular configuration could depend on a large number of factors, e.g. physical implementation, reliability requirements, flexiblity requirements, chip size, etc.

ADDRESS RECOGNITION

This concerns a method of organising address recognition circuitry in a memory in such a way as to facilitate:

a. virtual addressing, with independent storage areas for different processes in a multiprocessing system, or for different segments of a process.

b. storage reallocation, to meet varying read/write storage requirements in a multiprocessing system.

c. provision of a "pool" of spare read/write storage elements to provide replacements for failed elements, and their allocation as required.

This section is described in the context of LSI semiconductor memories, but the principles are applicable (with appropriate interpretation) to other types of memory.

In a conventional memory addressing system, $m$ bits of address are sent out from the unit (CPU/DMA) initiating a memory transfer. The most significant $(m-l)$ of these bits are decoded at one or more stages to provide $2^{m-l}$ Block Enable lines, which are used to enable up to $2^{m-l}$ memory blocks, each having $2^l$ lines. Since all decoding, enabling etc., is hardwired, this provides an absolute addressing system with no in-use flexibility (e.g. reallocation).

FIG. 5 illustrates the functioning of the virtual addressing system. Ignoring for the moment all references to $p$ bits (i.e. taking $p = 0$), it will be seen that the address generation at the initiating end is as in a conventional memory addressing system, but that the whole decoding function, on all address bits, is concentrated in the memory blocks themselves, each memory block deriving its own "block enable" signal. (A block is as defined previously). Further, the block identification is now performed, not by hardwiring, but by comparison with registers which may be set up by software. In this way any block may have its "block address" reallocated to meet current requirements.

FIG. 5 shows an extension of the basic virtual addressing system, which can be used to provide, for example, process or segment separation if required. As in a conventional system, $m$ bits of address are generated by an initiating unit (CPU/DMA) 27; to these are appended, at the most significant end, a group of $p$ bits which specify the number of the process currently being executed (say). these extra $p$ bits are compared at the store blocks 14 with a $p$-bit register 30 in each block, and "block enable" is only set true if equivalence is found for these $p$ bits as well as for the $m$-$l$ bits. The $p$-bit register 31 at the initiating end would be set by the computer's operating system each time the current process is changed (say), and the bit-appending action can be made automatic each time a transfer is initiated. The $p$-bit register 30 and the $(m-l)$ bit register 32 at the memory block are set up by soft ware as and when required, to provide variable stored identification bits for comparison with the corresponding address bits in the equivalence circuit 33. The "block enable" signal generated by the equivalence circuit 33 on line 34 gates through the least significant or $l$ bits of the address for decoding, as at 35, to select the lines of the memory array 17.

The mechanism for setting up the various software-settable registers must be separate from the "normal" virtual transfer mechanism. It is likely that each such register will have a "register address", which may be accessed by a "real" transfer. The same highways may be used for "real" transers as for "virtual" transfers, with differences in the control mechanism (e.g. change of state of a special "real/virtual" wire). Alternatively, a separate highway structure may be used, possibly arranged in a similar hierarchical fashion. The real addresses will ordinarily be organised in a hard-wired manner, since it is never necessary to alter them.

To summarise, each memory line in a memory array may be accessed, using a "virtual address", by a combination of:

i. Process number, if required; the number is held in a software settable register 30 within the memory block.

ii. Block number (within the process), representing the most significant part of the (virtual) address (within the process); the number is held in a software-settable register 32 within the block.

iii. Line number (within the block), decoded from the least significant address bits in a conventional manner.

Each software-settable register may be accessed using a "real address" in a conventional hardwired manner.

The real address may be divided into fields specifying, e.g., unit number, sub-unit number, register number, if required. Apart from the registers described here, the method may be used to set or interrogate any other registers, isolation controls, flip-flops, etc., which form part of the housekeeping and control functions of a computer.

We claim:

1. A digital memory system hierarchically organized with at least three levels in the hierarchy, and comprising a first level bus, a plurality of main memory units each independently interfaced to said first level bus, each main memory unit itself in turn comprising a second level bus within and respective to said main memory unit, a plurality of memory frames each independently interfaced to said second level bus, each memory frame in turn comprising a third level bus within and respective to said memory frame, and a plurality of memory storage blocks each independently interfaced to said third level bus, and wherein each said memory storage block comprises at least one storage array and is arranged for virtual addressing, said block containing means for decoding the whole of an address applied from said main bus through the several levels of the hierarchy.

2. A memory system according to claim 1 wherein address decoding in each memory storage block employs a block employs a block-identifying number or numbers in one or more block registers that are individually settable.

3. A memory system according to claim 2, further comprising a real addressing system for accessing said settable register or registers.

4. A memory system according to claim 1, comprising means for isolating each memory storage block from the remainder of the system.

5. A memory system according to claim 1, comprising means for isolating each memory frame or sub-unit from the remainder of the system.

6. A memory system according to claim 1, comprising means for isolating the whole memory unit from the first level bus.

7. A memory system according to claim 1, wherein each frame or sub-unit comprises a plurality of memory storage blocks in use and one or more spare blocks.

8. A memory system according to claim 1, further comprising a software-settable register for appending additional bite to the most significant end of an address applied to the first level bus from an initiating unit.

* * * * *